(12) United States Patent
Mooney et al.

(10) Patent No.: US 6,414,309 B2
(45) Date of Patent: Jul. 2, 2002

(54) METHODS AND APPARATUS FOR IMPROVING RESOLUTION AND REDUCING NOISE IN AN IMAGE DETECTOR FOR AN ELECTRON MICROSCOPE

(75) Inventors: Paul E. Mooney, Pleasanton; John A. Hunt, Fremont, both of CA (US)

(73) Assignee: Gatan, Inc., Pleasanton, CA (US)

( * ) Notice: Subject to any disclaimer, the term of this patent is extended or adjusted under 35 U.S.C. 154(b) by 0 days.

(21) Appl. No.: 09/795,072

(22) Filed: Feb. 26, 2001

Related U.S. Application Data (63) Continuation of application No. 09/096,925, filed on Jun. 12, 1996, now Pat. No. 6,194,719.
(60) Provisional application No. 60/049,397, filed on Jun. 13, 1997.

(51) Int. Cl.[7] .............................................. H01J 37/244
(52) U.S. Cl. ...................... 250/311; 250/310; 250/397; 250/487.1; 250/486.1; 250/488.1
(58) Field of Search ................................. 250/311, 310, 250/397, 487.1, 486.1, 488.1

(56) References Cited

U.S. PATENT DOCUMENTS

| | | | |
|---|---|---|---|
| 4,559,450 A | * 12/1985 | Robinson et al. ........... 250/310 |
| 4,647,811 A | 3/1987 | Galves et al. ............... 313/372 |
| 4,963,788 A | 10/1990 | King et al. .................. 313/503 |
| 5,065,029 A | 11/1991 | Krivanek .................. 250/441.1 |
| 5,266,809 A | 11/1993 | Engel .......................... 250/397 |
| 5,401,964 A | 3/1995 | Mancuso ..................... 250/307 |
| 5,424,541 A | * 6/1995 | Todokoro et al. ........... 250/310 |
| 5,635,720 A | * 6/1997 | Mooney et al. .............. 250/397 |
| 5,869,833 A | * 2/1999 | Richardson et al. ........ 250/310 |
| 5,990,483 A | * 11/1999 | Shariv et al. ................ 250/397 |

FOREIGN PATENT DOCUMENTS

| | | |
|---|---|---|
| DE | 39 43 211 A | 7/1991 |
| GB | 2 183 898 A | 6/1987 |
| WO | WO 97/13270 | 4/1997 |

* cited by examiner

Primary Examiner—Bruce Anderson
Assistant Examiner—Nikita Wells
(74) Attorney, Agent, or Firm—Killworth, Gottman, Hagan & Schaeff, L.L.P.

(57) ABSTRACT

Methods and apparatus are provided which improve the performance of electron imaging detectors by reducing the total interaction volume of the detector and/or reducing the energy converting volume of the detector. In one embodiment, a method for improving resolution and reducing noise in an imaging electron detector for an electron microscope is provided and includes the step of decelerating the energetic electrons either before the electrons interact with, or as the electrons interact with, the energy converting volume of an imaging electron detector. In other embodiments, the lateral spatial travel of energetic electrons is limited as they traverse the imaging electron detector, or, the extent of electron back scatter from the energetic electrons is limited.

11 Claims, 6 Drawing Sheets

METHODS AND APPARATUS FOR IMPROVING RESOLUTION AND REDUCING NOISE IN AN IMAGE DETECTOR FOR AN ELECTRON MICROSCOPE

This application is a continuation of U.S. patent application Ser. No. 09/096,925, filed Jun. 12, 1998, now U.S. Pat. No. 6,194,719, issued Feb. 27, 2001. This patent applicant claims the benefit of U.S. Provisional Application Ser. No. 60/049,397, filed Jun. 13, 1997.

BACKGROUND OF THE INVENTION

The present invention relates to methods and apparatus for use in an electron microscope to improve the detection of electron images, and more particularly to methods and apparatus for converting and using the energy of the electrons in the image to improve image resolution and reduce noise.

Electron microscopes use a beam of accelerated electrons which pass through or are deflected by a sample to provide an electron image and/or diffraction pattern of the sample. To provide a record of these images and/or diffraction patterns, at least a portion of the kinetic energy of such electrons is converted into some other form of energy which can be measured and permanently stored. One example of such an energy conversion process is the excitation of silver halide grains in a photographic emulsion. Chemical development converts the grains into a permanent distribution of silver particles, the density of which can be measured by commercially-available microdensitometers.

Another example of an energy conversion process for the electrons is the generation of light images by impinging the electrons onto scintillator materials (e.g., phosphors), and then capturing the light images and/or patterns onto a two-dimensional imaging sensor. One example of such an imaging sensor is a charge coupled device (CCD). The output from the CCD may be read as an analog signal, measured by an analog to digital converter, and then displayed (such as on a video monitor) and/or stored permanently (such as in the memory of a computer).

These two examples employ different means to convert and store the relative intensities of the electrons. However, the process of the deposition of the electrons' energies is the same. That is, once an accelerated electron enters the solid volume of the detector (photographic film emulsion or scintillator film), it starts to lose energy to the solid. This energy loss is at a rate which depends on the initial energy of the electron and the solid material through which it is traveling. The electron is also scattered randomly by the fields surrounding the atoms of the detector in a manner which alters the electron's direction or path of travel.

The result is that a series of accelerated electrons of the same initial energy, entering the solid detector at a specific point, will generate a set of paths which together fill a region of space resembling a cloud. This cloud-shaped volume can be defined as the envelope of all possible paths and is termed the interaction volume of the electron beam in the detector. The energy of the electron beam and the average atomic number density (Z density) of the detector material together determine the electron path's average behavior and thus the size and shape of the interaction volume.

Higher electron energies cause the interaction volume to be larger, while denser materials in the detector will cause it to be smaller. Denser materials also increase the average deflection angles of electrons and therefore cause more scattering of electrons back out of the detector. The calculation of paths the electrons will take and their resulting statistics is known in the art as "Monte Carlo" simulation.

The interaction of high energy electrons with the volume of the solid material of the detector generates spreading and noise which constitute primary limitations on the amount of spatial and intensity information obtainable from the incident electron image. One approach to dealing with the non-zero interaction volume of the detector has been to make the detector as thin as possible. In a thin sheet of film, for example, a beam of accelerated electrons experiences minimal scattering before exiting.

However, a disadvantage of using a thin film of the detector material is that only a small fraction of each electron's energy is utilized. Making the detector thicker increases sensitivity, but also increases scattering and degrades resolution. Further, where a scintillator is optically coupled to a CCD (such as, for example, by a fiber optic), the scintillator can be made thin so that light is generated only in a small volume near the point of entrance of the electrons. However, the electrons continue to be scattered after leaving the scintillator, with some electrons being back-scattered into the scintillator again.

Such back-scattered electrons will cause scintillation as well, creating an extended, noisy flare around the central spot of light created by the electrons in their incoming traversal of the scintillator. One solution to the problem of back-scattering is taught by Mooney et al, U.S. Pat. No. 5,635,720. There, the fiber optic which couples the scintillator to the detector is replaced by a light metal fold mirror and a lens coupling. Thus, the number of back-scattered electrons reentering the scintillator is reduced, but at the cost of a decrease in light gathering efficiency compared to fiber optics which decreases the overall sensitivity of the camera.

Thus, the need remains in this art for a method and apparatus for reducing the contribution to the total noise and resolution loss caused by the initial step of electron interaction with the detector without sacrificing sensitivity in light collection.

SUMMARY OF THE INVENTION

The present invention addresses that need by providing methods and apparatus which improve the performance of electron imaging detectors by reducing the total interaction volume of the detector and/or reducing the energy converting volume of the detector. In accordance with one aspect of the present invention, a method for improving resolution and reducing noise in an imaging electron detector for an electron microscope is provided and includes the step of decelerating the energetic electrons either before the electrons interact with, or as the electrons interact with, the energy converting volume of an imaging electron detector. By "energy converting volume", it is meant the interaction volume of the electrons within the energy converting medium of the detector. By "interaction volume", it is meant a region of space which is the envelope of all possible paths of the electrons in the volume of the detector.

In accordance with another aspect of the present invention, a method for improving resolution and reducing noise in an image detector for an electron microscope is provided and includes the step of limiting the lateral spatial travel of energetic electrons as they traverse the imaging electron detector. In accordance with yet another aspect of the present invention, a method for reducing noise in an image detector for an electron microscope is provided and includes the step of limiting the extent of electron back scatter into the imaging electron detector. In accordance with yet another aspect of the present invention, a method for improving resolution and reducing noise in an image detector for an electron microscope is provided and includes the step of selecting a pixel size for the measuring and/or storing portion of the imaging electron detector which encompasses substantially the entire interaction volume for a majority of energetic electrons in the detector.

The process of the present invention has utility in transmission electron microscope (TEM) analysis. Accordingly, it is a feature of the present invention to provide a method of detecting and imaging energetic electrons which not only enhances resolution, but also reduces noise. This and other features and advantages of the invention will become apparent from the following detailed description, the accompanying drawings, and the appended claims.

DETAILED DESCRIPTION OF THE PREFERRED EMBODIMENTS

The present invention will be described with reference to the drawing figures and to typical uses thereof in which an imaging device such as a charge-coupled device (CCD) camera 20 is mounted on the projection chamber 10 of a transmission electron microscope (TEM). However, it will be apparent to those skilled in this art that other constructions and arrangements may be utilized within the scope of the present invention including operation of a TEM in a scanning mode (STEM) and operation of a scanning electron microscope (SEM).

Figure 1:
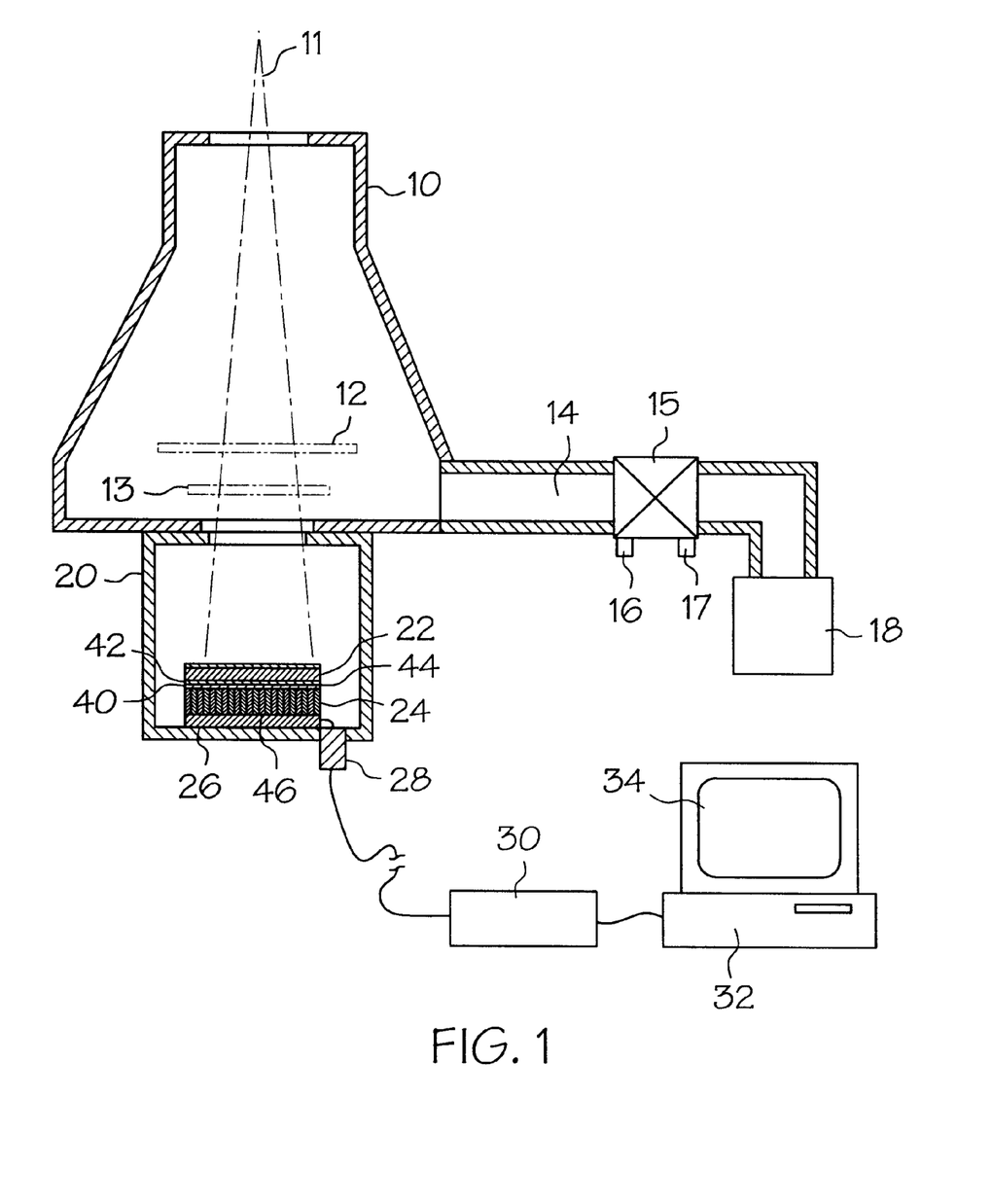
FIG. 1 is a schematic cross-sectional view of a typical arrangement for image detection in a transmission electron microscope.

Typically, the projection chamber is attached to the end of an optical column of a TEM and houses a viewing screen 12 which is either lowered into an observation position or raised into a position in which it does not intercept electron beam 11 which is projected into the chamber. The projection chamber may also house a film magazine comprising a transport mechanism (not shown) which inserts a sheet of photographic film 13 into an exposure position and returns the sheet into the magazine after exposure.

The typical projection chamber further has several ports suitable for attaching an imaging device such as a camera, one of which is usually situated at the bottom of the chamber. The chamber is normally evacuated via a vacuum pipe 14 leading to a gate valve 15 which can either open or close the chamber to a high vacuum (e.g., $10^{-6}$ torr) pump 18. The gate valve in most modern TEMs is controlled pneumatically via two inlets 16 and 17 such that introduction of pressurized air into one inlet causes the valve to open, and the introduction of pressurized air into the other inlet causes the valve to close.

An electron beam 11 forming an electron image or diffraction pattern from a specimen in the microscope traverses the projection chamber 10. Camera 20 includes a scintillator 22 which converts the electron image into a light image. Scintillator 22 is supported on a transfer optic such as fiber optic plate 24. By light image, it is generally meant light in the visible spectrum, although there are some scintillation materials which can produce light outside of the visible spectrum in either the near infrared or in the ultraviolet regions of the spectrum. It is within the scope of the present invention to use scintillator materials which produce images in the infrared, visible, and/or ultraviolet portion of the spectrum.

Fiber optic plate 24 is optically coupled to a an imaging sensor such as a two-dimensional charge-coupled device (CCD) sensor 26 with an optically-coupling oil layer 46. Such CCD sensors are commercially available from several manufacturers including Kodak, Ford, Scientific Imaging Technologies (SITe), Hamamatsu, Thomson CSF, and English Electric Valve Ltd. Preferred solid-state imaging devices are scientific grade CCDs whose imaging areas comprise 1024×1024 or more pixels. However, it should be appreciated that any imaging device which is capable of capturing a light image and producing an electronic signal may be utilized including a cathode ray television tube.

The preferred CCD must be operated cold to keep its dark current small enough so that the noise in the dark current accumulated during a typical exposure does not limit the performance of the camera. The typical exposure in an electron microscope is from about 1 to 20 seconds. Maintaining the CCD at a temperature of about −25° to about −40° C. is typically sufficiently low for the accumulated dark current to be acceptably small at exposure times of up to about 1 minute. Such a temperature is conventionally achieved using a thermoelectric cooling device (not shown), whose cold side may be in contact with the imaging sensor 26.

The CCD is connected to an external electronics unit 30 through a vacuum feed-through 28 which transfers the captured images to the memory of a digital computer 32. The images may be displayed on a view screen 34, such as a CRT, attached to the computer. For example, the images may be digitized with 14 bit dynamic range at 450 kHz and then displayed by a Power Macintosh computer using Digital/Micrograph software commercially available from Gatan, Inc., Pleasanton, Calif. Other details of operation are set forth in commonly-owned U.S. Pat. No. 5,065,029, the disclosure of which is incorporated by reference.

Figure 2:
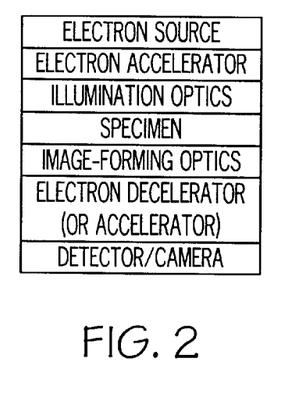
FIG. 2 is an illustration, in the form of a geometrically-oriented schematic, showing the arrangement of the elements of the present invention in a typical transmission electron microscope (TEM)

By arranging an imaging electron detector so that it is at a different electrical potential than the specimen, the interaction of the electrons with both the specimen and the detector may be controlled to optimize each interaction. Different possible arrangements are illustrated schematically in FIG. 2–4. In FIG. 2, in a transmission electron microscope (TEM), an electron accelerator is positioned between a source of electrons and the specimen to provide optimum interaction at the specimen. An electron decelerator (or in suitable cases, a second accelerator) is positioned immediately above the detector/camera to optimize electron energies as they impact the scintillator material on the imaging detector.

Figure 3:
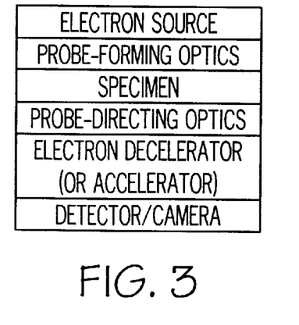
FIG. 3 is an illustration, in the form of a geometrically-oriented schematic, showing the arrangement of the elements of the present invention in a typical transmission electron microscope operating in a scanning mode (STEM)
Figure 4:
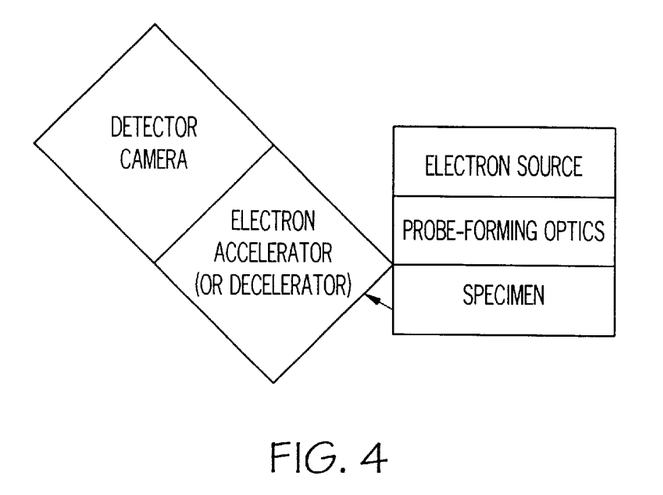
FIG. 4 is an illustration, in the form of a geometrically-oriented schematic, showing the arrangement of the elements of the present invention in a typical scanning electron microscope (SEM)

A possible arrangement for a transmission electron microscope operating in a scanning mode is shown in FIG. 3. Again, an electron decelerator (or in suitable cases an accelerator) is positioned immediately above the detector/camera to optimize electron energies as they impact the scintillator material on the imaging detector. The present invention is also applicable to scanning electron microscopes (SEM). As shown in FIG. 4, an electron accelerator (or in suitable cases a decelerator) is positioned immediately above the detector/camera to optimize electron energies as they impact the scintillator material on the imaging detector.

In these embodiments of the invention, the electrons are decelerated (or suitable accelerated) before they interact with the scintillator material on the imaging detector. Where a decelerating electric field is used, this is accomplished by positioning an electrostatic electron decelerator immediately above the detector to reduce the kinetic energy of the incoming electrons. By reducing the energies of the incoming electrons, their path lengths in the detector are reduced. This is because a lower energy electron may be completely decelerated within the energy converting volume of the detector. This also reduces the energy converting volume and increases the efficiency of energy conversion for virtually all known detectors.

At lower electron energies, such as for example, between about 20 to about 200 Kev, detector thickness may be optimized to maximize the conversion of energy from the electrons without compromising resolution of any image which is detected. Additionally, the problem of electron back scatter is significantly reduced because the electrons lose most of their energy while in the detector.

By positioning a variable voltage electrostatic decelerator immediately above the detector, one may select a voltage (and thus a deceleration of incoming electrons) which optimizes electron/detector interaction independent of the microscope acceleration voltage which was applied. Thus, microscope acceleration voltage may be chosen to optimize the interaction of the electrons with the sample to be imaged. Current practice, in which the electrons are accelerated from, for example an electron gun, must compromise between electron/specimen interaction and electron/detector interaction.

Figure 8:
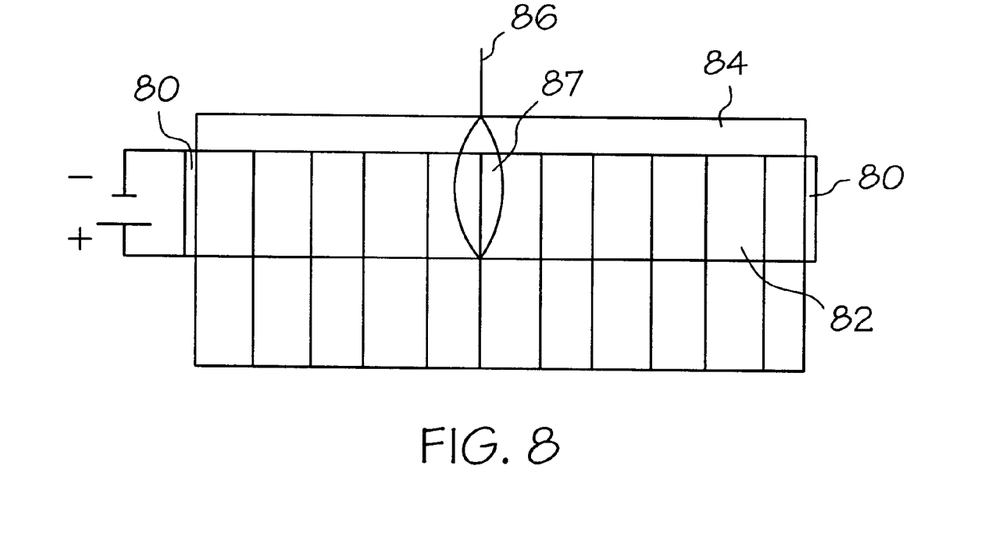
FIG. 8 is a schematic illustration of another embodiment of the invention using a re-accelerating electrode.

In another variation of the invention, an electrostatic accelerating voltage may be positioned immediately above or beneath the energy converting volume of the detector to accelerate emerging electrons through and away from the detector. This variation results in a decrease in the extent of electron back scatter and noise in the detector, improving resolution. One implementation of such an electron accelerating field is shown in FIG. 8 in which such a field is formed by depositing a thin conductive layer 80 onto the sides of a first fiber optic 82 located immediately beneath scintillator 84. Such an electrode may be formed, for example, by deposition of a layer of indium tin oxide and then connecting the electrode to a suitable power source. The electron beam 86 (with interaction volume 87 shown), after passing through scintillator 84 is accelerated away from the scintillator to reduce back-scattering.

Figure 5:
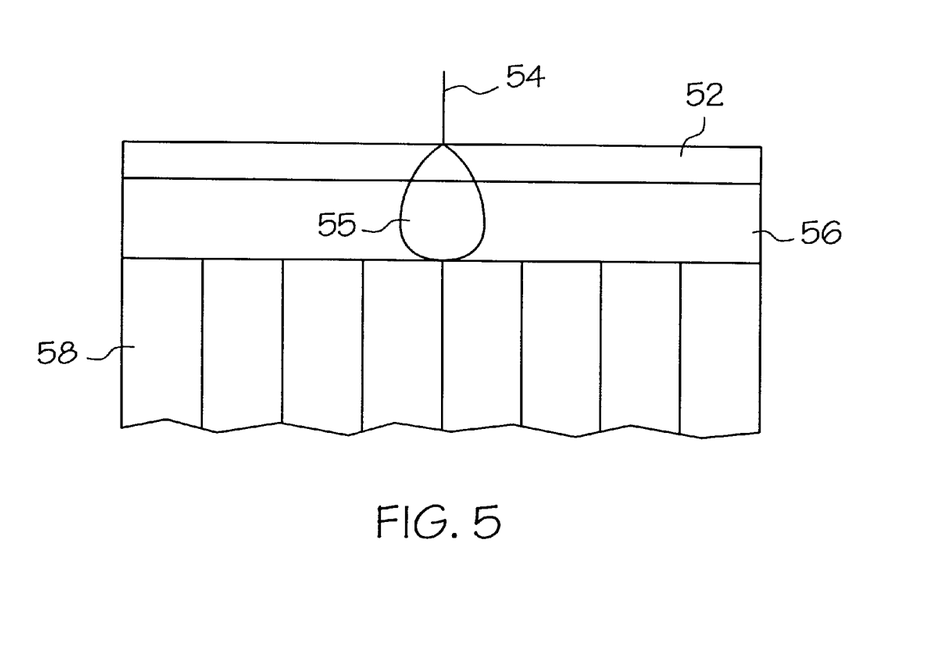
FIG. 5 is a schematic illustration of another embodiment of the invention using a decelerating coating.
Figure 6:
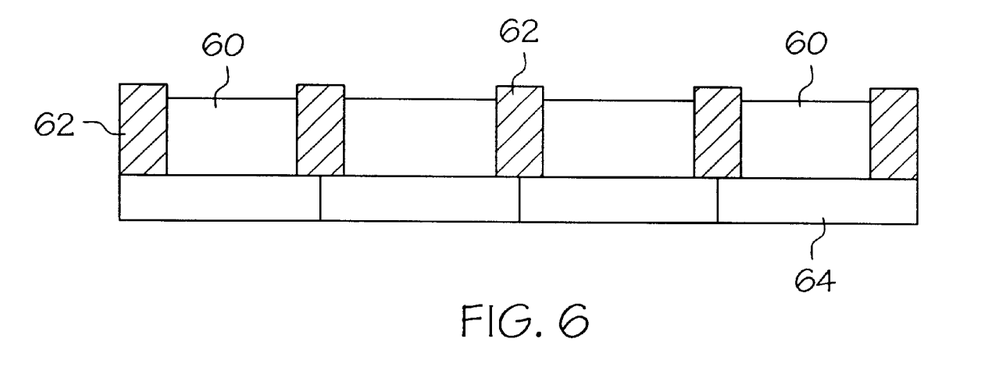
FIG. 6 is a schematic illustration of another embodiment of the invention in which areas of scintillator materials between walls of non-scintillator materials are used.

In an alternative embodiment shown in FIG. 5, the energetic electrons are decelerated by positioning a non-scintillating material 52 between the electron beam 54 (with interaction volume 55 depicted) and the scintillating material 56. A fiber optic 58 directs the light to a suitable detector (not shown). Traversing the non-scintillator material would reduce the kinetic energies of the electrons prior to their impinging upon the scintillator. The type of material selected and its thickness are selected to optimize the deceleration and spread of the electron beam. However, one disadvantage of this particular embodiment of the invention is that the non-scintillator material would tend to increase the angular spread of electron paths prior to reaching the detector.

In another version of this embodiment, the detector is fabricated using high Z materials (i.e., materials having an average atomic number density which is greater than the majority of materials). For example, cesium iodide is both a high Z material as well as a scintillator. Thus, in this embodiment, the kinetic energies of the electrons are reduced as the electrons interact with the volume of the detector to a greater extent than with conventional detector/scintillator materials.

In yet another embodiment of the invention, image resolution is improved and noise reduced by limiting the lateral spatial travel of the energetic electrons as they traverse the volume of the detector. Such lateral spatial travel may be reduced through the use of areas or columns of detector material oriented substantially parallel to the path of the incoming electrons, such columns being substantially surrounded by high Z material. The high Z material acts as a barrier to lateral travel of the electrons.

One implementation of this embodiment of the invention is illustrated in FIG. 5 in which areas of scintillator materials 60 are contained between walls of high Z material 62 on an imaging detector 64.

Another implementation of this embodiment of the invention can utilize optical fibers made with scintillator material and oriented substantially parallel to the incoming electrons and surrounded by an electron decelerating barrier of a high Z material. In the embodiment shown in FIGS. 7A–7C, scintillator material 70 forms the core of optical fibers 72. The optical fibers are then selectively etched, as shown in FIG. 7B, to expose the scintillator material 70. Finally, as shown in FIG. 7C, the areas around the scintillator material are then packed with a high Z material 74.

Figure 7A:
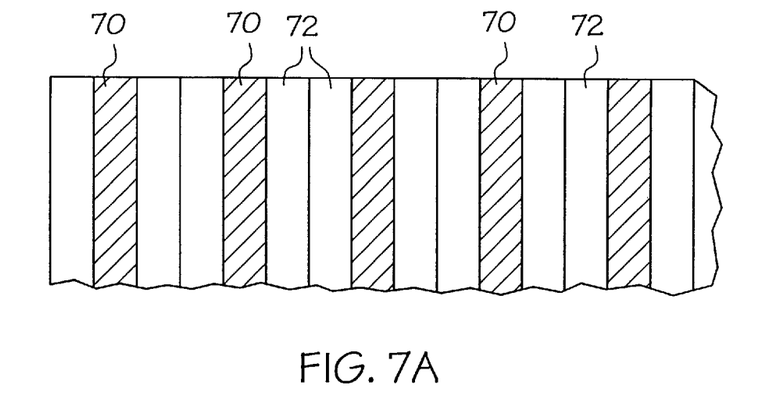
FIGS. 7A–7C are schematic illustrations of another embodiment of the invention in which columns of scintillator materials are formed by etching clad materials followed by packing of non-scintillator materials around the columns of scintillator materials.
Figure 7B:
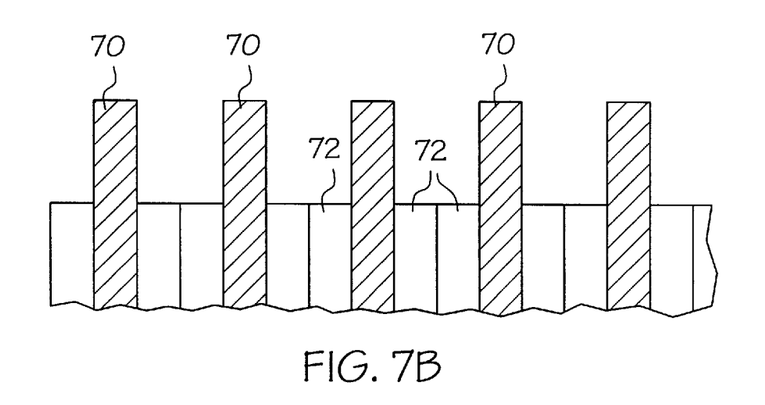
Figure 7C:
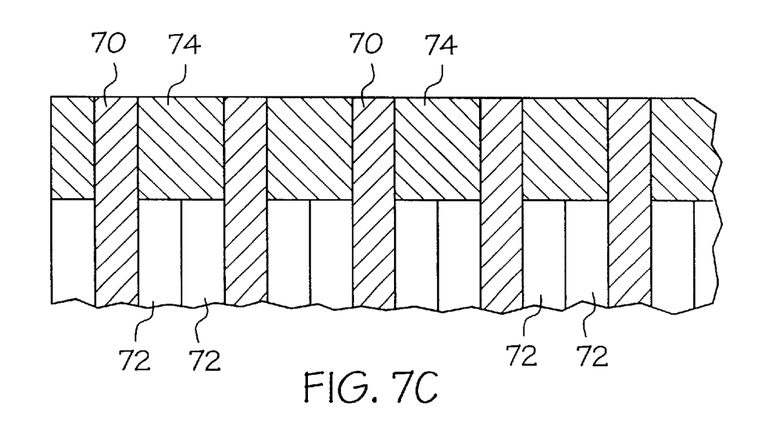

In the embodiment of the invention shown in FIGS. 7A–7C, the high Z barrier materials may also be aligned with the boundaries of the spatial elements (pixels) of the imaging detector. In this manner, light from the scintillator material is directed to individual pixels on the imaging detector. For example, the imaging detector may be a CCD as illustrated and described above. In such a case, the barriers are carefully aligned with the pixels of the CCD. Alternatively, the imaging detector may be an amorphous silicon detector in which the scintillator and barrier materials have been deposited directly onto the surface of the silicon detector.

Figure 11:
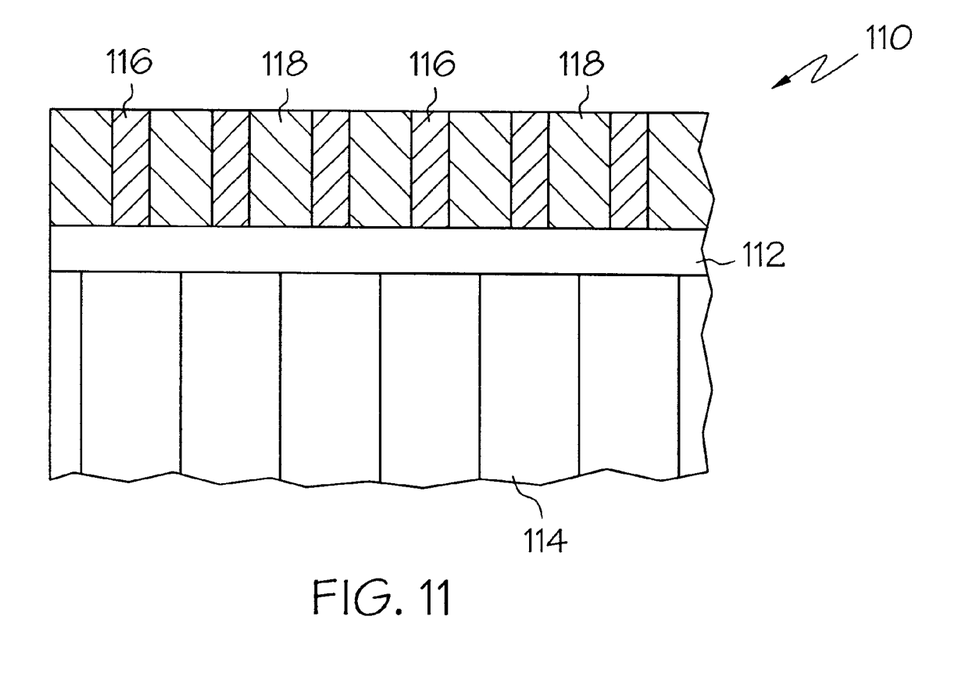
FIG. 11 is a variation, in schematic form, of the embodiment illustrated in FIGS. 7A–7C.

In a variation on the embodiment shown in FIGS. 7A–7C, in FIG. 11 a non-scintillating electron deceleration layer 110 may be superimposed over layer 112 of scintillator material atop fiber optic 114. Lateral travel of the electrons is reduced by forming deceleration layer 110 with substantially vertically-oriented columns of a low Z material 116 (through which the electrons will pass, but give up energy) surrounded by areas of high Z barrier material 118.

As discussed above, noise from electron back scatter reentering the detector may be reduced by positioning an electrostatic accelerating voltage beneath the energy conversion volume of the detector. Noise and back scatter may also be reduced by utilizing a low Z material (i.e., a material having an average atomic number density which is less than the majority of materials) for the support structure of the of the scintillator or the transfer optic may be fabricated of a low Z material. A low Z material will tend not to cause significant interactions with the electrons so that fewer electrons will be back scattered toward the detector.

In still another embodiment of the invention, resolution is improved and noise reduced by selecting a pixel size for the measuring and/or storing portion of the imaging detector such that the pixel size encompasses substantially the entire interaction volume for a majority of the energetic electrons in the detector (which have evenly distributed points of entry). The total converted energy of an electron which decelerates completely within the energy conversion volume is constant. If all or substantially all of this energy is accumulated within a single spatial bin or pixel, noise is greatly reduced. Binning is a technique whereby the energy detected by groups of adjacent pixels on an imaging detector are summed together. In this embodiment, the pixel size for the imaging detector must be chosen to be large enough so that a majority of electrons will have expected interaction volumes which will fall within that size, with only a minority of electron having interaction volumes which will cross pixel boundaries.

Figure 9:
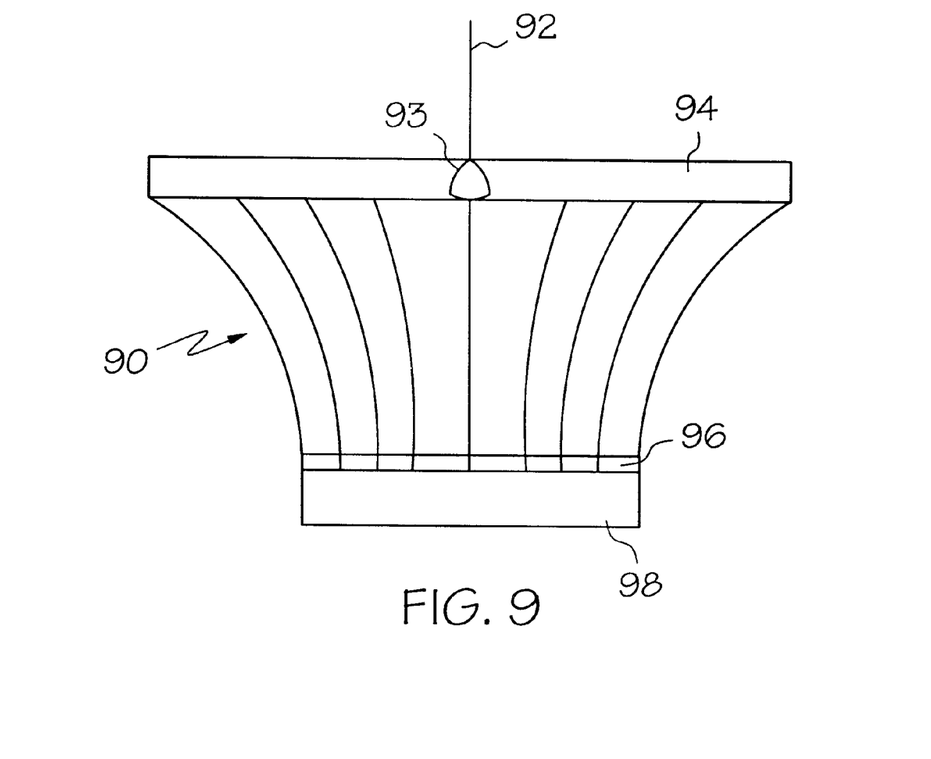
FIG. 9 is a schematic illustration of another embodiment of the invention using reducing optical fibers.
Figure 10:
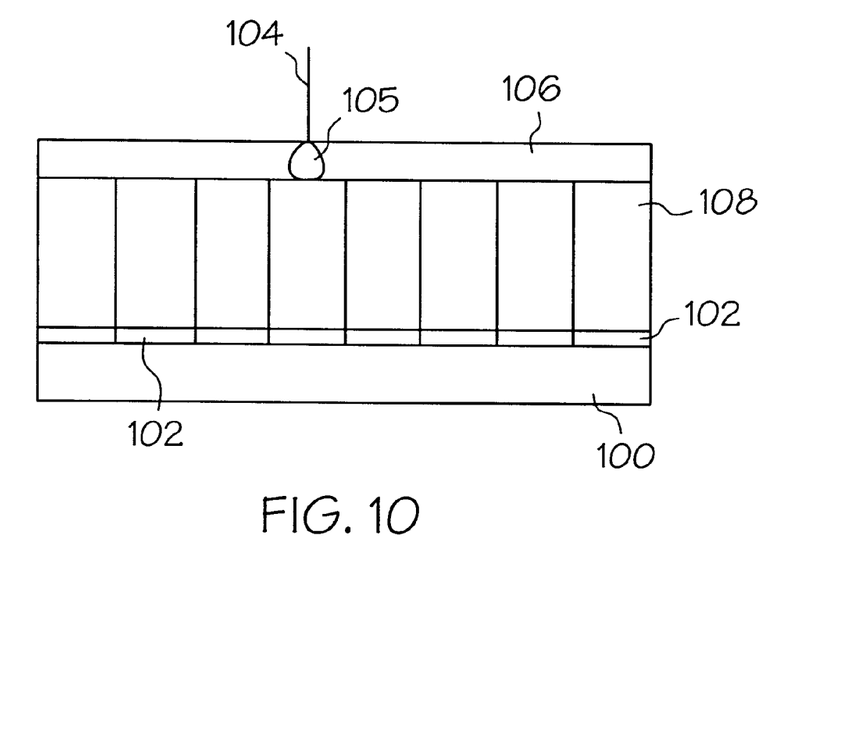
FIG. 10 is a schematic illustration of another embodiment of the invention using a large pixel detector.

This can be accomplished, for example, as shown in FIG. 9 by using a reducing fiber optic 90 such that the electron 92 (with interaction volume 93) impinging on scintillator 94 is contained within a single pixel 96 of an imaging detector 98. Alternatively, as shown in FIG. 10, a detector 100 having a large pixel size for individual pixels 102 is used such that electron 104 (with interaction volume 105) passing through scintillator 106 and fiber optic 108 is contained within a single pixel of the detector.

While certain representative embodiments and details have been shown for purposes of illustrating the invention, it will be apparent to those skilled in the art that various changes in the methods and apparatus disclosed herein may be made without departing from the scope of the invention. For example, combinations of the above techniques may also be utilized and be within the scope of this invention.

What is claimed is:

1. A method for improving resolution and reducing noise in an imaging electron detector for a transmission electron microscope comprising:
providing a beam of energetic electrons and an imaging electron detector; and decelerating said energetic electrons either before said electrons interact with, or as said electrons interact with, the energy converting volume of said imaging electron detector.

2. A method as claimed in claim 1 in which said energetic electrons are decelerated by passing through a decelerating electric field.

3. A method as claimed in claim 1 in which said imaging electron detector includes a layer of a scintillator material and in which energetic electrons are decelerated as they pass through the thickness of said scintillator material.

4. A method as claimed in claim 3 in which the thickness of said scintillator material is selected to maximize the conversion of kinetic energy from said energetic electrons as they traverse said scintillator material.

5. A method as claimed in claim 3 in which said scintillator material comprises a high Z material.

6. A method as claimed in claim 5 in which said scintillator material comprises cesium iodide.

7. A method as claimed in claim 1 in which said imaging electron detector includes a layer of a scintillator material and in which said energetic electrons are decelerated by passing them through a non-scintillator material prior to their impinging upon said layer of scintillator material.

8. A method for improving resolution and reducing noise in an image detector for an transmission electron microscope comprising:
providing a beam of energetic electrons forming an image or diffraction pattern from a specimen;
impinging said beam of energetic electrons onto an imaging electron detector; and
decelerating said energetic electrons either before said electrons interact with, or as said electrons interacts with, the energy converting volume of said imaging electron detector.

9. A method for improving resolution and reducing noise in an imaging electron detector for a transmission electron microscope comprising:
providing a source of a beam of energetic electrons and impringing said beam onto a specimen;
forming an image or diffraction pattern of said specimen using said beam of energetic electrons; and
detecting said image or diffraction pattern with an imaging electron detector; wherein said beam of energetic electrons is accelerated prior to interaction of saidbeam of energetic electrons with said specimen and said beam of energetic electrons is decelerated either before said electrons interact with, or as said electrons interact with, the energy converting volume of said imaging electron detector.

10. A method as claimed in claim 9 in which said beam of energetic electrons is accelerated to optimize the ineraction od said beam with said specimen.

11. A method as claimed in claim 9 in which said beam of energetic electrons is decelerated to optimize the interaction of said beam with said imaging electron detector.

* * * * *

UNITED STATES PATENT AND TRADEMARK OFFICE
CERTIFICATE OF CORRECTION

PATENT NO. : 6,414,309 B2
DATED : July 2, 2002
INVENTOR(S) : Paul E. Moony and John A. Hunt It is certified that error appears in the above-identified patent and that said Letters Patent is hereby corrected as shown below:

<u>Title page,</u>
Item [63], "Continuation of application No. 09/096,925, filed on Jun. 12, 1996, now Pat. No. 6,194,719." should be -- Continuation of application No. 09/096,925, filed on Jun. 12, 1998, now Pat. No. 6,194,719. --;

<u>Column 5,</u>
Line 6, "Fig. 24" should be -- Fig. 2-4 --;

<u>Column 8,</u>
Line 24, "image detector for an transmission" should be -- imaging electron detector for a transmission --;
Line 44, "saidbeam" should be -- said beam --; and
Line 52, "od" should be -- of --.

Signed and Sealed this

Eleventh Day of March, 2003

JAMES E. ROGAN
*Director of the United States Patent and Trademark Office*